United States Patent
Li et al.

(10) Patent No.: US 10,103,064 B2
(45) Date of Patent: Oct. 16, 2018

(54) TRANSISTOR STRUCTURE INCLUDING EPITAXIAL CHANNEL LAYERS AND RAISED SOURCE/DRAIN REGIONS

(71) Applicant: Taiwan Semiconductor Manufacturing Co., Ltd., Hsin-Chu (TW)

(72) Inventors: Kun-Mu Li, Zhudong Township (TW); Chii-Horng Li, Zhubei (TW); Tze-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 31 days.

(21) Appl. No.: 14/288,587

(22) Filed: May 28, 2014

(65) Prior Publication Data

US 2015/0349065 A1    Dec. 3, 2015

(51) Int. Cl.
*H01L 29/36* (2006.01)
*H01L 21/8238* (2006.01)
*H01L 27/092* (2006.01)

(52) U.S. Cl.
CPC ........ *H01L 21/823814* (2013.01); *H01L 21/823807* (2013.01); *H01L 27/092* (2013.01)

(58) Field of Classification Search
CPC ............ H01L 21/8238; H01L 27/092; H01L 21/8228; H01L 27/0826; H01L 438/199; H01L 21/823807; H01L 21/823814; H01L 21/823821; H01L 21/823828; H01L 21/823835; H01L 21/823842; H01L 21/82385; H01L 21/823857

USPC ....................................................... 438/199
See application file for complete search history.

(56) References Cited

U.S. PATENT DOCUMENTS

| | | |
|---|---|---|
| 6,271,551 B1 | 8/2001 | Schmitz et al. |
| 7,005,333 B2 | 2/2006 | Li |
| 7,883,977 B2 | 2/2011 | Babcock et al. |
| 7,888,747 B2 | 2/2011 | Hokazono et al. |
| 7,985,985 B2 | 7/2011 | Hokazono |
| 8,134,159 B2 | 3/2012 | Hokazono |
| 8,476,706 B1 | 7/2013 | Chidambarrao et al. |
| 2005/0093021 A1* | 5/2005 | Ouyang .......... H01L 21/823807 257/194 |
| 2005/0151202 A1 | 7/2005 | Wieczorek et al. |
| 2007/0254422 A1* | 11/2007 | Chidambarrao et al. ..... 438/197 |
| 2008/0017931 A1* | 1/2008 | Shih ............... H01L 21/823807 257/374 |
| 2012/0032275 A1* | 2/2012 | Haran ............... H01L 21/28518 257/401 |
| 2012/0080759 A1 | 4/2012 | Ema et al. |

(Continued)

Primary Examiner — Julio J Maldonado
Assistant Examiner — Stanetta Isaac
(74) Attorney, Agent, or Firm — Eschweiler & Potashnik, LLC (57) ABSTRACT

The present disclosure provides an integrated circuit device including n-channel and p-channel MOSFETs. The MOSFETs include epitaxial grown raised source/drain regions and epitaxial grown channel regions. An epitaxially grown diffusion barrier layer separates the epitaxial grown channel regions from underlying deep n-wells and p-wells. The epitaxial source/drain regions allow for a low thermal budget that in combination with the diffusion barrier layer allows the deep n-wells and p-wells to be heavily doped while preserving high purity in the channel layers.

20 Claims, 5 Drawing Sheets

(56) References Cited

U.S. PATENT DOCUMENTS

| | | | |
|---|---|---|---|
| 2012/0138953 A1* | 6/2012 | Cai | H01L 21/823807 257/77 |
| 2012/0261718 A1* | 10/2012 | Sosa Cortes | H01L 29/41783 257/192 |
| 2013/0005096 A1* | 1/2013 | Park et al. | 438/229 |
| 2014/0353718 A1* | 12/2014 | Loubet | H01L 27/092 257/192 |

\* cited by examiner

TRANSISTOR STRUCTURE INCLUDING EPITAXIAL CHANNEL LAYERS AND RAISED SOURCE/DRAIN REGIONS

BACKGROUND

The present disclosure relates to integrated circuit devices having field effect transistors and methods of manufacturing them.

As integrated circuit devices are scaled down, designers face a tradeoff between performance (speed) and leakage (power usage). Heavier well doping reduces body resistance, but increases diffusion of impurities into transistor channels. Impurities in the channels increase charge carrier scattering and lead to higher leakage rates. Heavier source/drain doping reduces source/drain resistance but generally leads to greater junction depth and related short channel effects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides integrated circuit devices having high performance transistors. High quality crystalline channel regions for the transistors are formed in a layer of epitaxially grown semiconductor above deep n-wells and or deep p-wells, which can be relatively heavily doped. Dopant diffusion from the wells to the channel regions is inhibited by an additional layer of epitaxially grown semiconductor formed above the wells and below the channel regions. The additional layer acts as a diffusion barrier layer. Epitaxially grown source/drain regions are also provided. Epitaxially grown source/drain regions can be produced with a low thermal budget in comparison to source/drain regions formed by ion implantation. A low thermal budget is maintained to reduce diffusion of dopants from the wells to the channel regions, which allows the wells to be heavily doped while still maintaining high purity in the channel regions.

Figure 1:
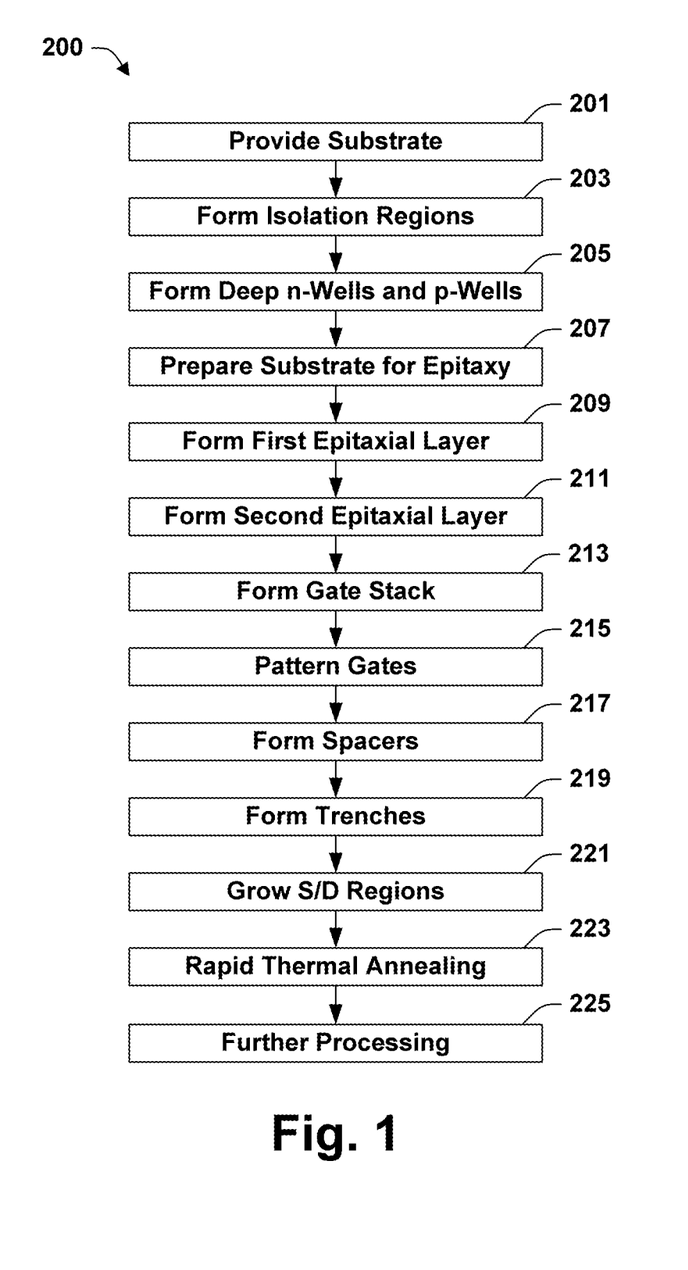
FIG. 1 is a flow chart of a method according to some embodiments of the present disclosure.

FIG. 1 provides a flow chart of a method 200, which is an example in accordance with some embodiments of the present disclosure. FIGS. 2-12 illustrate an integrated circuit device 100 as is undergoes manufacture by the method 200. In most embodiments, the integrated circuit device 100 is a complementary metal oxide semiconductor (CMOS) device. Device 100 is an example in accordance with some embodiments of the present disclosure.

Figure 2:
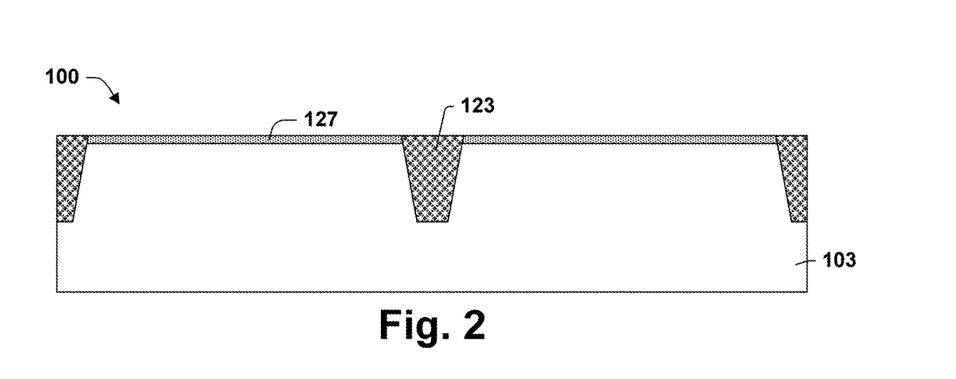
FIG. 2-11 illustrate an integrated circuit device according to some embodiments of the present disclosure at various intermediate stages of manufacture.

Method 200 begins with act 201, providing a substrate 103, and act 203, forming isolation regions 123, as shown in FIG. 2. Substrate 103 can be any suitable substrate that includes a semiconductor body. In some embodiments, substrate 103 is a semiconductor wafer. The substrate 103 can be another type of structure, such as semiconductor-on-insulator (SOI). In some embodiments, the semiconductor body is Si. The semiconductor body can alternatively be Ge, a SiGe, or another group III-V material, compound, or the like. Isolation regions 123 can be any suitable type of isolation regions, such as isolations regions formed by local oxidation of silicon (LOCOS) or shallow trench isolation (STI) regions. In some embodiments, isolation regions 123 are STI regions as shown in FIG. 2. A thin layer of native oxide 127 may be formed at exposed surfaces of substrate 103.

Figure 3:
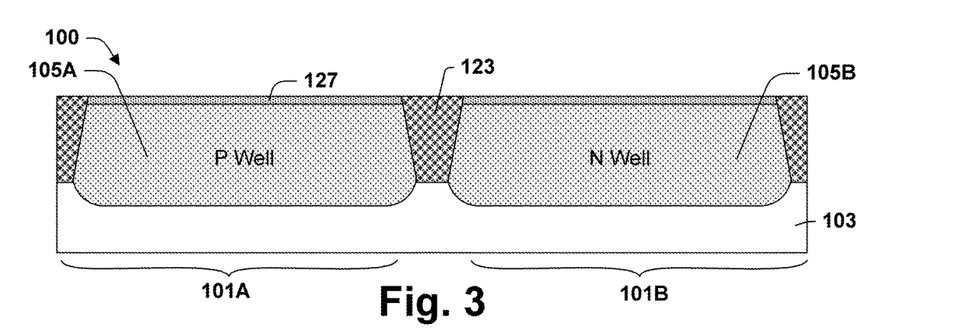

Method 200 continues with act 205, forming deep p-wells 105A in nMOS regions 101A and deep n-wells 105B and in pMOS regions 101B as shown in FIG. 3. In most embodiments, wells 105 (deep p-wells 105A and deep n-wells 105B) are formed by high energy ion implantation. A high energy ion implantation uses ions with energies of 100 keV or greater. In some embodiments, the ion implantation uses ions with energies that are 500 keV or less. In some embodiments, the implant dose that forms deep p-wells 105A or deep n-wells 105B is a heavy implant dose. A heavy implant dose is at least $1.0 \times 10^{13}$ atoms/cm$^2$. In most embodiments, the implant doses are $8.0 \times 10^{13}$ atoms/cm$^2$ or less. In some embodiments, the implant doses are limited to $2 \times 10^{13}$ atoms/cm$^2$ or less, which can be desirable for preventing excessive diffusion. An oxide layer 127, which can be a native oxide layer, or one or more other layers can be provided to protect the surface of substrate 103 during these implants. A rapid thermal anneal (RTA) process can be applied following act 205 to repair implantation damage in substrate 103.

Figure 4:
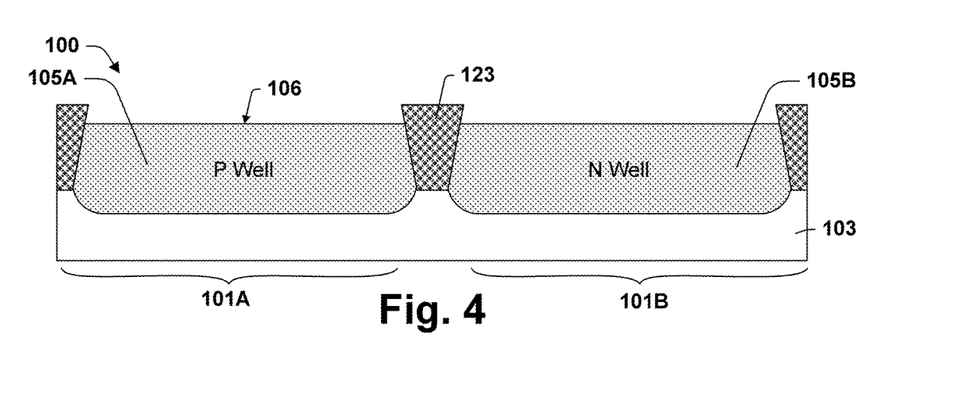

Method 200 continues with act 207, which prepares a surface 106 of semiconductor 103 as shown in FIG. 4 for epitaxial layer growth. This generally involves removing any oxide layer 127 from surface 106. In some embodiments, this is an etch process that also removes an upper layer of p-wells 105A and deep n-wells 105B as shown in FIG. 4.

Figure 5:
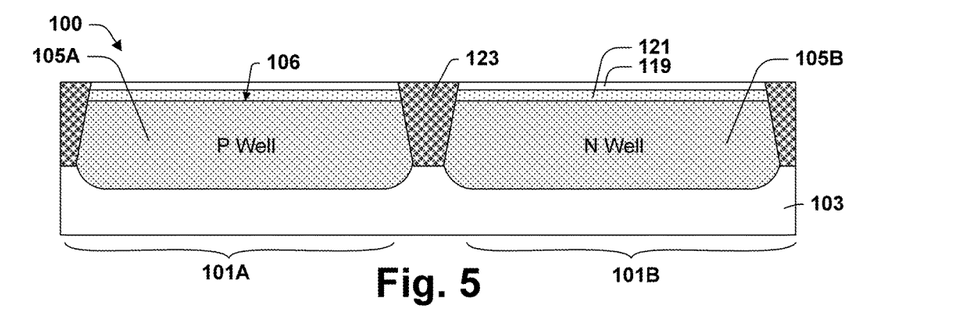

Method 200 continues with act 209, epitaxially growing diffusion barrier layer 121 on surface 106 and act 211, epitaxially growing channel layer 119 on diffusion barrier layer 121, to produce a structure as shown in FIG. 5. Diffusion barrier layer 121 has a composition and thickness functional to inhibit diffusion of dopants from wells 105 into channel layer 119. In typical embodiments, diffusion barrier layer 121 is formed simultaneously in both nMOS regions 101A and pMOS regions 101B and accordingly has the same thickness and essentially the same composition in both of these regions. In most embodiments, diffusion barrier layer 121 has a thickness in the range from 10 nm to 30 nm. In most embodiments, diffusion barrier layer 121 is at least 90% Si and from 0.1% to 7% Ge, C, or Ge and C. In some of these embodiments, diffusion barrier layer 121 is SiGe. In some others of these embodiments, diffusion barrier layer 121 is SiC.

Channel layer 119 is grown over diffusion barrier layer 121 and has a composition and thickness suitable for a transistor channel. In some embodiments, channel layer 119 is formed simultaneously in both nMOS regions 101A and pMOS regions 101B and accordingly has the same thickness and essentially the same composition in both of these regions. In most embodiments, channel layer 119 has a thickness in the range from 1 nm to 10 nm. In some embodiments, channel layer 119 is Si. In some other embodiments, channel layer 119 is at least 97% Si, but includes up to 3% Ge, C, or Ge and C. In some of these embodiments, channel layer 119 is SiGe. In some others of these embodiments, channel layer 119 is SiC. In most embodiments in which channel layer 119 includes Ge and or C, diffusion barrier layer 121 includes at least twice the total concentration of Ge and C.

In most embodiments, the combined thickness of channel layer 119 and diffusion barrier layer 121 is between 10 nm and 40 nm. The combined thickness includes functional thicknesses for both channel layer 119 and diffusion barrier layer 121, but is not too great to prevent effective coupling between gate electrodes in and deep p-wells 105A and deep n-wells 105B. In most embodiments, a functional thickness for channel layer 119 is less than a functional thickness for diffusion barrier layer 121. In most embodiments, channel layer 119 has a thickness between 10% and 35% the thickness of diffusion barrier layer 121.

Figure 6:
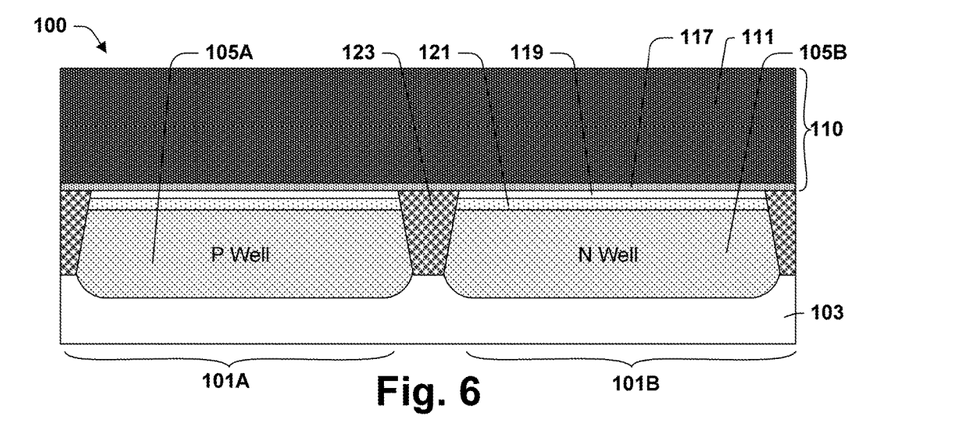

Method 200 continues with act 213, forming gate stack 110 over channel layer 119 as shown in FIG. 6. Gate stack 110 generally includes at least gate dielectric layer 117 and gate electrode layer 111. In some embodiments, dielectric layer 117 is a high-k dielectric layer. In some embodiments, gate stack 110 is a dummy gate stack and gate electrode layer 111 is a dummy gate electrode layer, such as polysilicon that is later replaced by a metal electrode. Gate electrode layer 111 can include multiple layers and can have one compositions in nMOS regions 101A and another composition in pMOS regions 101B.

Figure 7:
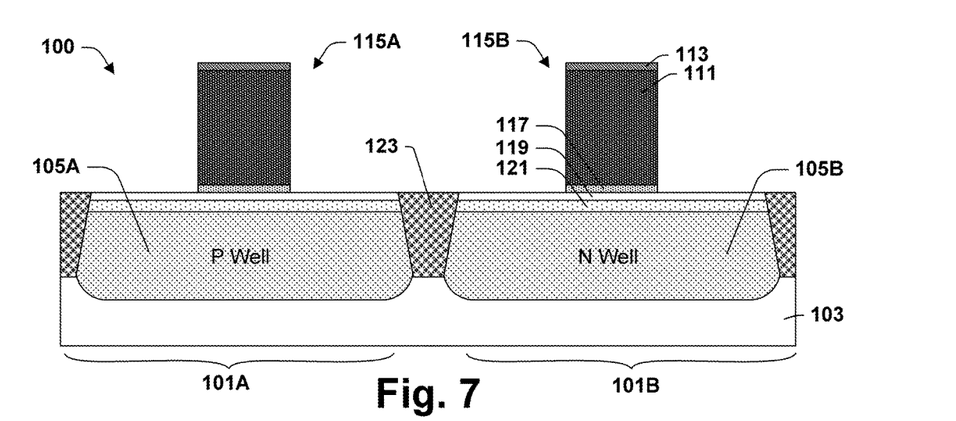
Figure 8:
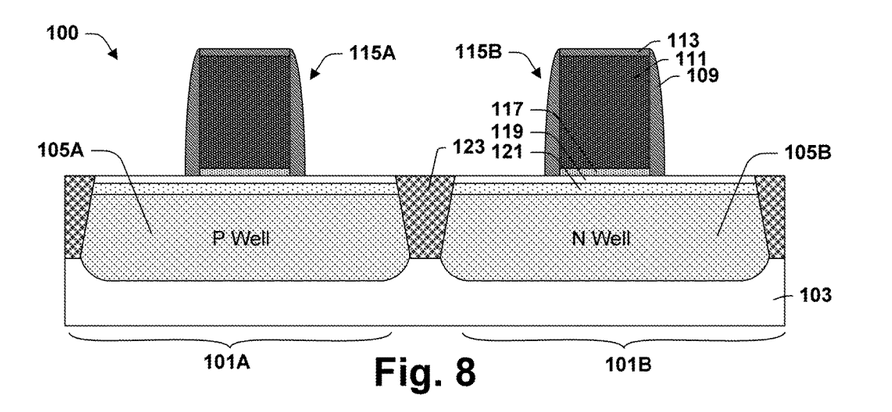

Method 200 continues with act 215, which is patterning gate stack no to form gates 115 as shown in FIG. 7. In most embodiments, patterning gate stack no includes forming a hard mask layer 113, photolithography, and plasma etching. Act 217 forms spacers 109 to the sides of gates 111 as shown in FIG. 8. Spacers 109 include one or more layers of suitable materials. Suitable materials can include, for example, silicon dioxide, silicon nitride, silicon oxynitride (SiON).

Figure 9:
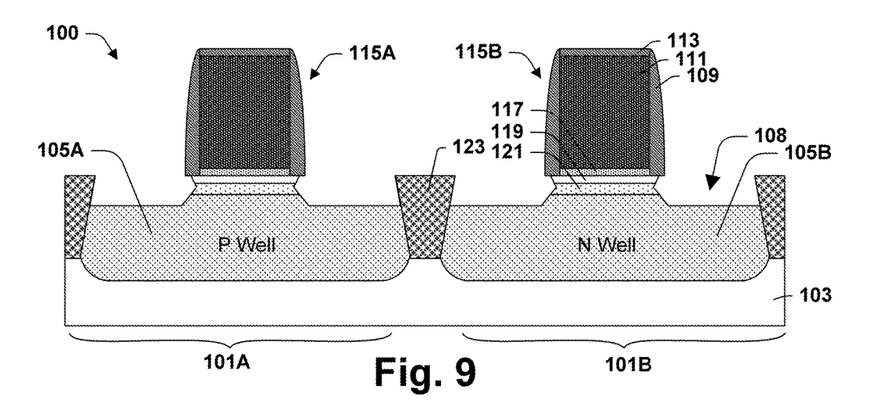

Method 200 continues with act 219, forming trenches 108 at desired locations for source and drain regions to the sides of gates 115 as shown in FIG. 9. In some embodiments, act 219 is an anisotropic wet etch process. An anisotropic wet etch can be a wet etch process that is selective according to crystal surface orientation. The etch can use, for example, tetra-methyl ammonium hydroxide (TMAH) solution in a volume concentration range of 1% to 10% and a temperature in the range from 15° C. to 50° C.

Figure 10:
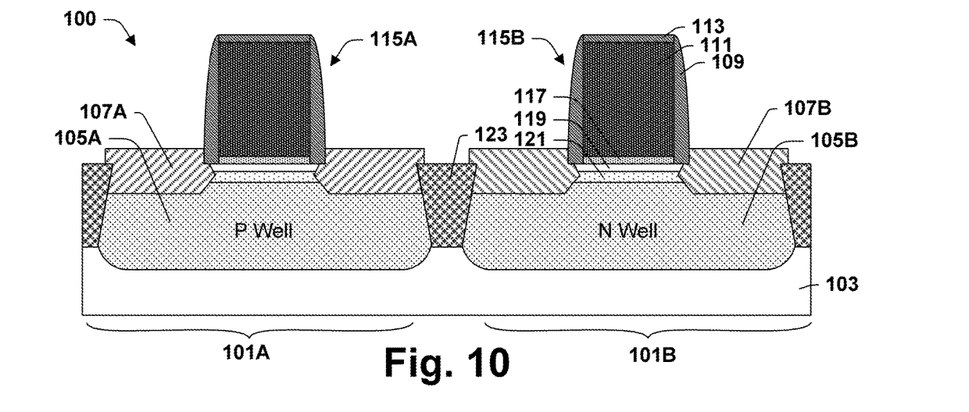

Method 200 continues with act 221, forming source/drain regions 107 as shown in FIG. 10. Source/drain regions 107 include source/drain regions 107A with n-type doping in nMOS regions 101A and source/drain regions 107B with p-type doping in pMOS regions 101B. Source/drain regions 107 are formed by epitaxial growth processes, which can include cyclical deposition and etching (CDE). In some embodiments, source/drain regions 107 are epitaxially grown at low temperatures. In some embodiments, low temperatures for epitaxially growth of source/drain regions 107 are temperatures in the range from 600° C. to 750° C. In most embodiments, source/drain dopants are introduced as source/drain regions 107 are epitaxially grown. In most embodiments, additional source/drain doping through ion implantation is not necessary and a high temperature anneal to repair damage caused by such ion implantation is avoided.

Source/drain regions 107 can include multiple layers. In some embodiments, source/drain regions 107 include a first layer that is operative as a diffusion barrier layer and a second layer that provide the operative portion of the source/drain region 107. A diffusion barrier layer can be provided by including a Ge or C content as described in relation to diffusion barrier layer 121. In embodiments in which a source/drain region 107 includes a first layer that is operative as a diffusion barrier layer, the second layer can have a higher concentration of the n-type or p-type dopant.

In some embodiments, source/drain regions 107A or source/drain regions 107B place strain on channel layer 119 that increases charge carrier mobility in channel layer 119 for nMOS transistors 115A or pMOS transistors 115B. In some embodiments, source/drain regions 107 exert strains on channel layer 119 that increase charge carrier mobility for both nMOS transistors 115A and pMOS transistors 115B. For nMOS transistors 115A, a mobility-increasing strain involves providing source/drain regions 107A with a crystal structure having a lattice constant smaller than that of channel layer 119. For example, SiC has a smaller lattice constant than Si an can be used source/drain regions 107A. For pMOS transistors 115B, a mobility-increasing strain involves providing source/drain regions 107B with a crystal structure having a lattice constant larger than that of channel layer 119. For example, SiGe has a larger lattice constant than Si an can be used for source/drain regions 107B.

Figure 11:
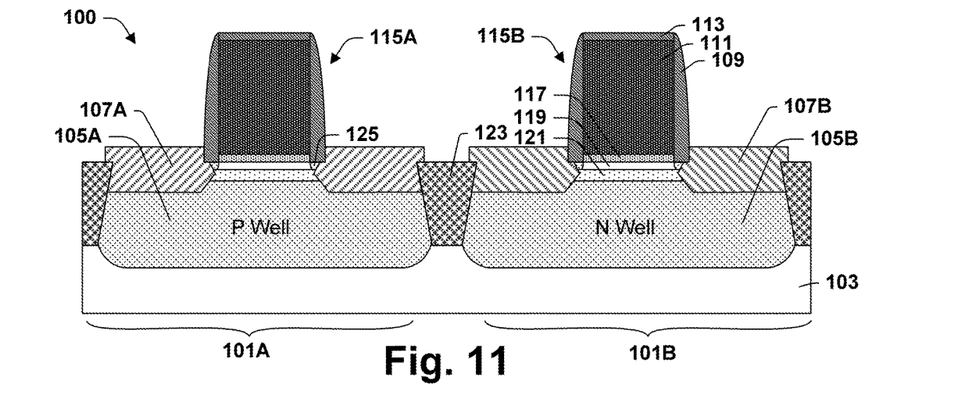

Method 200 continues with act 223, rapid thermal annealing (RTA). RTA 223 causes dopants to diffuse from source/drain regions 107 into channel layer 119 to produce source/drain extension regions 125 as shown in FIG. 11. Diffusion barrier layer 121 can be functional during this diffusion process to assist in keeping junctions between cannel layer 119 and source/drain regions 107 shallow.

Forming source/drain regions 107 by epitaxial growth allows them to be formed with a lower thermal budget as compared to source/drain regions formed by ion implantation. In most embodiments, the entire method 200 subsequent to formation of channel layer 119 has a low thermal. The low thermal budget in conjunction with diffusion barrier layer 121 allows deep wells 105 to be heavily doped as described above while maintaining high purity in channel layer 119. In some embodiments, from act 209, forming diffusion barrier layer 121 through act 223, rapid thermal annealing, the maximum temperature for annealing is 900° C. or less. In some embodiments, the maximum annealing temperature is 850° C. or less.

Method 200 concludes with act 225, further processing to complete the integrated device 100. In some embodiments, the further processing includes a replacement gate process where a dummy gate stack is removed and replaced with a high-k metal gate stack. Act 225 can include additional front-end-of-line (FEOL) processing followed by back-end-of-line (BEOL) processing.

The present disclosure provides an integrated circuit device including re-channel MOSFETs formed over p-doped regions of the semiconductor body and p-channel MOSFETs formed over n-doped regions of the semiconductor body. The re-channel MOSFETs include epitaxial grown n-type raised source/drain regions, epitaxial grown channel regions, gate electrodes, and gate dielectrics separating the gate electrodes from the epitaxial grown channel regions. The p-channel MOSFETs include epitaxial grown p-type raised source/drain regions, epitaxial grown channel regions, gate electrodes, and gate dielectrics separating the gate electrodes from the epitaxial grown channel regions. An epitaxially grown diffusion barrier layer separates the epitaxial grown channel regions of the n-channel MOSFETS from the p-doped regions of the semiconductor body and the epitaxial grown channel regions of the p-channel MOSFETS from the n-doped regions of the semiconductor body. The epitaxial source/drain regions allow for a low thermal budget that in combination with the diffusion barrier layer allows the n-doped and p-doped regions of the semiconductor body to be heavily doped while preserving high purity in the channel layers.

The present disclosure also provides an integrated circuit device including n-MOS regions and p-MOS regions, p-wells formed in the n-MOS regions, n-wells formed in the p-MOS regions, a diffusion barrier layer formed over both the n-wells and the p-wells, an epitaxial grown channel layer formed over the diffusion barrier layer in both the n-MOS and the p-MOS regions, n-type transistors formed in the n-MOS regions, the n-type transistors having gates formed over the channel layer, p-type transistors formed in the p-MOS regions, the p-type transistors having gates formed over the channel layer, and raised source/drain regions formed adjacent the channel layer on two sides of each of the n-type transistor and p-type transistor gates.

The present disclosure provides a method of manufacturing an integrated circuit device that includes providing a semiconductor substrate including a semiconductor body, doping to form n-wells and p-wells within the semiconductor body, epitaxially growing a first semiconductor layer over the n-wells and the p-wells, the first layer comprising Si and having a sufficient thickness and a sufficient concentration of Ge and/or C to provide an effective diffusion barrier layer, epitaxially growing a second semiconductor layer over the first semiconductor layer, the second layer comprising Si and having no Ge and no C or a lower concentration of Ge and C than the first layer, forming a gate or dummy gate stack over the second layer, the gate or dummy gate stack extending over both the n-wells and the p-wells, patterning the stack to form gates or dummy gates, forming spacers abutting the gates or dummy gates, etching trenches in the semiconductor body adjacent the spacers, and epitaxially growing semiconductor in the trenches to form raised source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a semiconductor body comprising p-doped regions and n-doped regions separated by isolation regions;
n-channel MOSFETs formed over the p-doped regions of the semiconductor body and comprising:
epitaxial grown n-type raised source/drain regions recessed below an upper portion of the p-doped regions;
epitaxial grown channel regions disposed between the epitaxial grown n-type raised source/drain regions and over the p-doped regions;
source/drain extension regions separating the epitaxial grown n-type raised source/drain regions from the channel regions;
gate electrodes; and
gate dielectrics separating the gate electrodes from the epitaxial grown channel regions of the n-channel MOSFETs;
p-channel MOSFETs formed over the n-doped regions of the semiconductor body and comprising:
epitaxial grown p-type raised source/drain regions recessed below an upper portion of the n-doped regions;
epitaxial grown channel regions disposed between the epitaxial grown p-type raised source/drain regions and over the n-doped regions;
source/drain extension regions separating the epitaxial grown p-type raised source/drain regions from the channel regions;
gate electrodes; and
gate dielectrics separating the gate electrodes from the epitaxial grown channel regions of the p-channel MOSFETs; and
an epitaxially grown diffusion barrier layer disposed directly on the p-doped regions and the n-doped regions, separating the epitaxial grown channel regions and the source/drain extension regions of the n-channel MOSFETS from the p-doped regions of the semiconductor body and separating the epitaxial grown channel regions and the source/drain extension regions of the p-channel MOSFETS from the n-doped regions of the semiconductor body;
wherein the source/drain extension regions of the n-channel MOSFETS and the p-channel MOSFETS are disposed directly on the epitaxially grown diffusion barrier layer.

2. The device of claim 1, wherein the epitaxially grown diffusion barrier layer has the same composition where it separates the epitaxial grown channel regions of the n-channel MOSFETS from the p-doped regions of the semiconductor as it does where it separates the epitaxial grown channel regions of the p-channel MOSFETS from the n-doped regions of the semiconductor body.

3. The device of claim 1, wherein the epitaxially grown channel regions of the n-channel MOSFETs have the same composition as the epitaxial grown channel regions of the p-channel MOSFETs.

4. The device of claim 1, wherein:
the n-doped regions of the semiconductor body have a concentration of n-type dopants of at least $1.0\times10^{13}$ atoms/cm$^2$ and no greater than $8.0\times10^{13}$ atoms/cm$^2$; and
the p-doped regions of the semiconductor body have a concentration of p-type dopants of at least $1.0\times10^{13}$ atoms/cm$^2$ and no greater than $8.0\times10^{13}$ atoms/cm$^2$.

5. The device of claim 1, wherein:
an aggregate thickness of the epitaxially grown channel regions of the n-channel MOSFETs and the underlying diffusion barrier layer is between 10 nm and 40 nm; and
the aggregate thickness of the epitaxially grown channel regions of the p-channel MOSFETs and the underlying diffusion barrier layer is between 10 nm and 40 nm.

6. The device of claim 1, wherein the epitaxially grown channel regions have a thickness between 10% and 35% the thickness of the diffusion barrier layer.

7. The device of claim 1, wherein source/drain regions of an n-channel or p-channel MOSFET have upper angled sidewalls and lower angled sidewalls that meet at respective tips, and wherein the tips are disposed below the channel regions and the source/drain extension regions of the n-channel MOSFETs or the p-channel MOSFETs, and directly abut the diffusion barrier layer.

8. An integrated circuit device, comprising:
n-MOS regions and p-MOS regions;
p-wells formed in the n-MOS regions;
n-wells formed in the p-MOS regions, the n-wells separated from the p-wells by isolation regions;
a diffusion barrier layer disposed directly on both the n-wells and the p-wells;
an epitaxial grown channel layer formed over the diffusion barrier layer in both the n-MOS and the p-MOS regions;
n-type transistors formed in the n-MOS regions, the n-type transistors having gates formed over the channel layer;
p-type transistors formed in the p-MOS regions, the p-type transistors having gates formed over the channel layer;
raised source/drain regions formed at two sides of each of the n-type transistor and p-type transistor gates;
source/drain extension regions disposed directly on the diffusion barrier layer and between upper portions of the raised source/drain regions and the channel layers.

9. The integrated circuit device of claim 8, wherein the diffusion barrier layer in an epitaxial layer comprising SiGe, SiC, or SiGeC.

10. The integrated circuit device of claim 9, wherein the channel layer comprises SiGe, SiC, or SiGeC with a total concentration of Ge and C that is half or less the total concentration of Ge and C in the diffusion barrier layer.

11. The integrated circuit device of claim 9, wherein the diffusion barrier layer comprises at least 90% Si atoms and from 0.1% to 7% atoms selected from a group consisting of Ge and C.

12. The integrated circuit device of claim 9, wherein the diffusion barrier layer has a thickness between 10 nm and 30 nm.

13. The integrated circuit device of claim 8, wherein the raised source/drain regions strain the channel layer so as to raise charge carrier mobility in the channels of both the n-type and p-type transistors.

14. The device of claim 8, wherein the raised source/drain regions on two sides of a transistor gate have upper angled sidewalls and lower angled sidewalls that meet at respective tips under outer edges of a gate of the transistor, and wherein the tips directly abut the diffusion barrier layer.

15. A method of manufacturing an integrated circuit device, comprising:
providing a semiconductor substrate including a semiconductor body;
doping to form n-wells and p-wells within the semiconductor body;
epitaxially growing a first semiconductor layer directly on the n-wells and the p-wells, the first layer comprising Si and having a sufficient thickness and a sufficient concentration of Ge and/or C to provide an effective diffusion barrier layer;
epitaxially growing a second semiconductor layer directly on the first semiconductor layer, the second semiconductor layer comprising Si and having no Ge and no C or a lower concentration of Ge and C than the first layer;
forming a gate or dummy gate stack over the second semiconductor layer, the gate or dummy gate stack extending over both the n-wells and the p-wells;
patterning the stack to form gates or dummy gates;
forming spacers abutting the gates or dummy gates;
etching trenches alongside the gates or dummy gates, wherein the trenches are formed through the first semiconductor layer and the second semiconductor layer, and extend below upper surfaces of the n-wells and p-wells under the gates or dummy gates;
epitaxially growing semiconductor in the trenches to form raised source/drain regions; and
forming source/drain extension regions directly on the first semiconductor layer and between the raised source/drain regions and the second semiconductor layer.

16. The method of claim 15, wherein the doping to form n-wells comprises implanting at least $1.0\times10^{13}$ atoms/cm$^2$ of n-type dopants.

17. The method of claim 16, wherein the n-wells are not doped with more than $2\times10^{14}$ atoms/cm$^2$ of n-type dopants.

18. The method of claim 15, wherein the doping to form p-wells comprises implanting at least $1.0\times10^{13}$ atoms/cm$^2$ of p-type dopants.

19. The method of claim 15, wherein the p-wells are not doped with more than $2\times10^{14}$ atoms/cm$^2$ of p-type dopants.

20. The method of claim 15, further comprising:
rapid thermal annealing to out diffuse dopants from the raised source/drain region to form the source/drain extension regions;
wherein the epitaxially grown first semiconductor layer prevents diffusion from the n-wells and p-wells into the second semiconductor layer.

* * * * *